United States Patent
Desai et al.

(10) Patent No.: US 9,959,915 B2
(45) Date of Patent: May 1, 2018

(54) VOLTAGE GENERATOR TO COMPENSATE FOR PROCESS CORNER AND TEMPERATURE VARIATIONS

(71) Applicant: SanDisk Technologies LLC, Plano, TX (US)

(72) Inventors: Amul Desai, Milpitas, CA (US); Hao Nguyen, San Jose, CA (US); Man Mui, Fremont, CA (US); Ohwon Kwon, Pleasanton, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days. days.

(21) Appl. No.: 15/151,617

(22) Filed: May 11, 2016

(65) Prior Publication Data

US 2017/0169867 A1    Jun. 15, 2017

Related U.S. Application Data

(60) Provisional application No. 62/266,494, filed on Dec. 11, 2015.

(51) Int. Cl.
*G11C 7/00* (2006.01)
*G11C 7/12* (2006.01)
(Continued)

(52) U.S. Cl.
CPC ............... *G11C 7/12* (2013.01); *G11C 7/10* (2013.01); *G11C 7/22* (2013.01); *H01L 27/0211* (2013.01)

(58) Field of Classification Search
CPC .... G11C 7/12; G11C 7/22; G11C 7/10; G11C 16/30; G11C 16/08; G11C 11/5642; G11C 2211/5634; G11C 27/005; G11C 7/06; G11C 11/56; G11C 11/5621; G11C 11/5628; G11C 5/147
See application file for complete search history.

(56) References Cited

U.S. PATENT DOCUMENTS 6,084,812 A * 7/2000 Joo ..................... G11C 7/12
                                                       365/203
7,580,303 B2 * 8/2009 Nishimura ........... G11C 7/04
                                                       365/189.09
(Continued)

FOREIGN PATENT DOCUMENTS

EP        2124125        11/2009

OTHER PUBLICATIONS

International Search Report and Written Opinion dated Feb. 6, 2017 for international application PCT/US2016/060993.

*Primary Examiner* — Hien Nguyen
(74) *Attorney, Agent, or Firm* — Stoel Rives, LLP

(57) ABSTRACT

The present disclosure describes a system, a circuit, and method for process and temperature compensation in an integrated circuit. For example, the system includes a bus, a data latch, and a voltage generator. The data latch includes a plurality of transistors coupled to the bus. The voltage generator includes a tracking transistor with one or more physical characteristics that substantially match one or more respective physical characteristics—e.g., gate width and gate length dimensions—of at least one of the plurality of transistors in the data latch. The voltage generator is configured to adjust a pre-charged voltage on the bus based on an electrical characteristic of the tracking transistor.

20 Claims, 5 Drawing Sheets

(51) Int. Cl.
*H01L 27/02* (2006.01)
*G11C 7/22* (2006.01)
*G11C 7/10* (2006.01)

(56) References Cited

U.S. PATENT DOCUMENTS

| | | | |
|---|---|---|---|
| 8,222,954 | B1 | 7/2012 | Ren et al. |
| 8,238,185 | B2* | 8/2012 | Lee ........................ G11O 5/143 |
| | | | 365/189.09 |
| 2005/0237104 | A1* | 10/2005 | Chou ..................... G05F 3/247 |
| | | | 327/538 |
| 2008/0117702 | A1 | 5/2008 | Henry et al. |
| 2009/0080267 | A1* | 3/2009 | Bedeschi ................ G11O 5/147 |
| | | | 365/189.09 |
| 2009/0086554 | A1* | 4/2009 | Chanussot ............ G11C 11/413 |
| | | | 365/189.09 |
| 2009/0262587 | A1* | 10/2009 | Park ...................... G11C 11/404 |
| | | | 365/189.09 |
| 2010/0074014 | A1 | 3/2010 | Dunga et al. |
| 2010/0246293 | A1* | 9/2010 | Dudeck .................... G11C 7/04 |
| | | | 365/194 |
| 2011/0116320 | A1* | 5/2011 | Zhang ................ G11C 11/5642 |
| | | | 365/185.21 |
| 2014/0327307 | A1 | 11/2014 | Chu et al. |

* cited by examiner

VOLTAGE GENERATOR TO COMPENSATE FOR PROCESS CORNER AND TEMPERATURE VARIATIONS

CROSS-REFERENCE TO RELATED APPLICATION

This application claims the benefit of U.S. Provisional Patent Application No. 62/266,494, titled "Local Bus Precharge Compensation," filed on Dec. 11, 2015, which is incorporated herein by reference in its entirety.

BACKGROUND

Field

The described embodiments relate to a voltage generator to compensate for process and temperature variations in an integrated circuit.

Related Art

In semiconductor manufacturing, process variations can occur when fabricating an integrated circuit (IC). The process variations can be represented by process corners, which refer to variations in parameters—e.g., gate width, gate length, and oxide thickness—used to fabricate the IC. Process corners indicate extreme conditions within which the IC can properly function. Within the process corners, the IC can run slower or faster than a typical performance. The IC can also run at lower or higher temperatures and voltages across the process corners. But, if the IC does not function at any of the process corners, the IC is considered to have an inadequate design margin.

To improve design margin, a circuit designer simulates the IC across different process corners and temperatures to assess the electrical characteristics of the IC across these conditions. Based on the simulation results, the circuit designer can ensure that the IC properly functions within the design margin.

SUMMARY

The present disclosure describes a system, circuit, and method for compensating process corner and temperature variations in integrated circuits. Specifically, embodiments of the present disclosure describe compensating for process and temperature variations for a data latch circuit. Based on this disclosure, a person of ordinary skill in the art will recognize that other integrated circuits—in addition to the data latch circuit—can implement the process corner and temperature compensation techniques described below.

In certain embodiments, the system for compensating process corner and temperature variations includes a bus, a data latch, a voltage generator, and a sensing circuit. The data latch includes a plurality of transistors coupled to the bus. The voltage generator includes a tracking transistor with one or more physical characteristics that substantially match one or more respective physical characteristics—e.g., gate width and gate length dimensions—of at least one of the plurality of transistors in the data latch. In certain embodiments, the tracking transistor and the at least one of the plurality of transistors in the data latch are fabricated using the same process technology—e.g., particular method to fabricate integrated circuits. The voltage generator is configured to adjust a pre-charged voltage on the bus based on an electrical characteristic of the tracking transistor. And, the sensing circuit is coupled to the data latch via the bus and is configured to discharge the pre-charged voltage on the bus via a strobe transistor controlled by a strobe control signal.

Also, in certain embodiments, the circuit for compensating process corner and temperature variations includes a tracking transistor, an adjustable resistor circuit, a current source, and a buffer circuit. The tracking transistor has one or more physical characteristics that substantially match one or more respective physical characteristics of a transistor in a data latch. The adjustable resistor circuit is coupled to the tracking transistor and is configured to adjust a resistance of the resistor circuit based on temperature. The current source is configured to provide a current to the tracking transistor and the adjustable resistor circuit. The current generates a voltage between the current source and the adjustable resistor circuit. And, the buffer circuit is configured to receive the voltage at an input terminal and to transfer the voltage from the input terminal to an output terminal. The buffer circuit's output terminal is coupled to the data latch.

Further, in certain embodiments, the method for compensating process corner and temperature variations includes generating, adjusting, and discharging operations. The generating operation includes generating, with a voltage generator, a pre-charged voltage on a bus coupled to a data latch. The adjusting operation includes adjusting the pre-charged voltage based on temperature. The data latch includes a plurality of transistors coupled to the bus. The voltage generator includes a tracking transistor having one or more physical characteristics that substantially match one or more respective physical characteristics of at least one of the plurality of transistors in the data latch. Further, the discharging operation includes discharging, with a sensing circuit, the pre-charged voltage on the bus via a strobe transistor controlled by a strobe control signal.

This Summary is provided for purposes of summarizing some embodiments to provide a basic understanding of aspects of the subject matter described herein. Accordingly, the above-described features are merely examples and should not be construed as narrowing the spirit or scope of the subject matter in this disclosure in any way. Other features, aspects, and advantages of the subject matter described herein will become apparent from the following Detailed Description, Figures, and Claims.

BRIEF DESCRIPTION OF FIGURES

The accompanying drawings, which are incorporated herein and form a part of the specification, illustrate embodiments and, together with the description, further serve to explain the embodiments and to enable a person skilled in the relevant art to make and use the invention.

Figure 1:
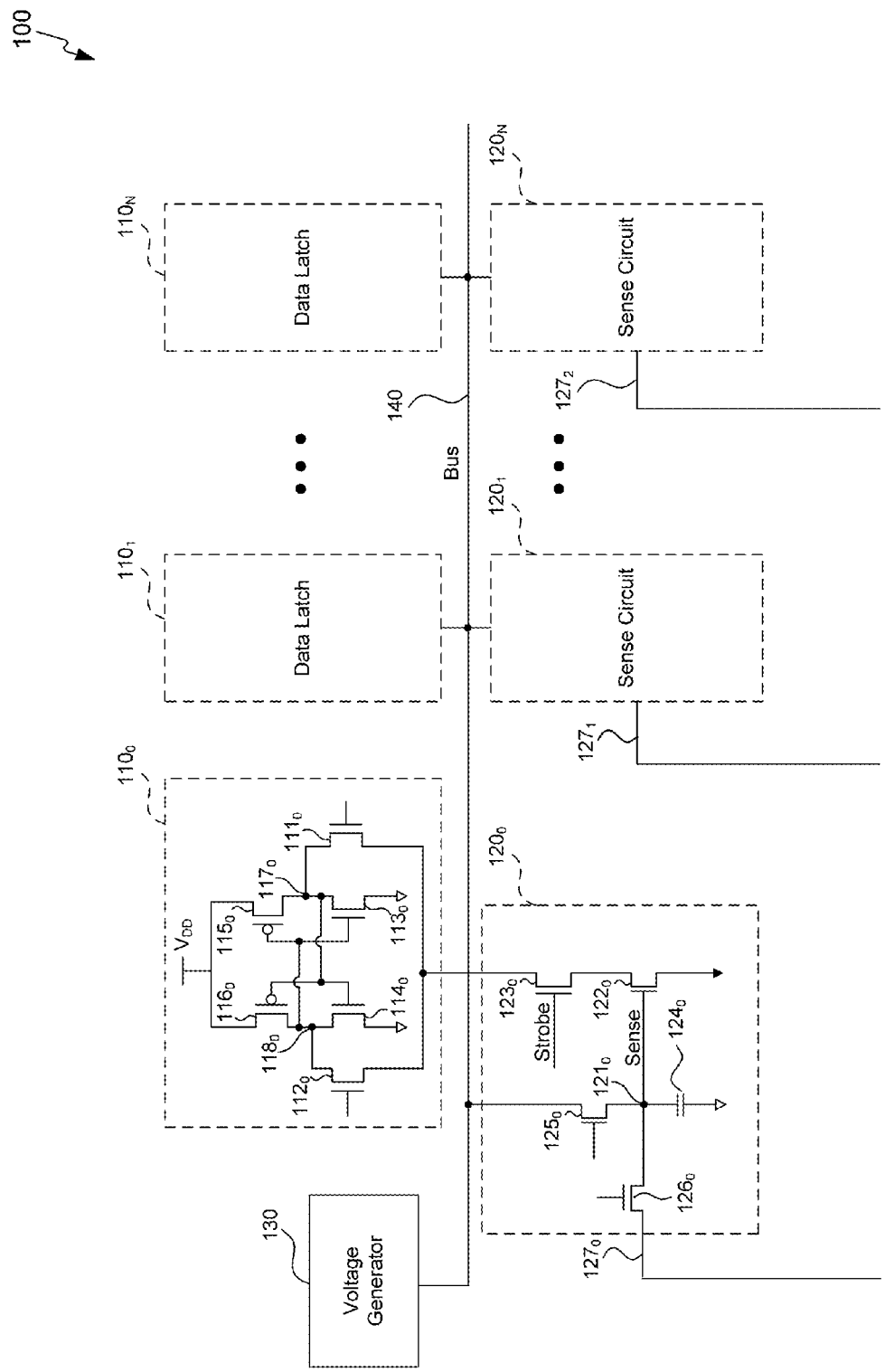
FIG. 1 is an illustration of an example data latch system, according to one or more embodiments.

Embodiments will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

The present disclosure describes embodiments to compensate for process corner and temperature variations in an integrated circuit—e.g., a data latch circuit. As will be described in detail below, a voltage generator (e.g., voltage generator 130 of FIGS. 1 and 3) provides a pre-charge voltage to a bus (e.g., bus 140 of FIG. 1) during a memory read operation. As would be understood by a person of ordinary skill in the art, the pre-charge voltage on the bus (e.g., bus 140 in FIG. 1) provides a voltage bias to certain transistors in the data latch (e.g., pass transistors $111_0$ and $112_0$ in FIG. 1) to prevent or mitigate current leakage in the data latch. The pre-charge voltage can be adjusted based on temperature to track electrical characteristics of one or more devices in the data latch circuit. Among other benefits, the adjustable pre-charge voltage improves performance of a memory read operation by reducing a strobe control signal timing window associated with the read operation.

As described in detail below with respect to FIG. 2, the strobe control signal timing window refers to a window of time in which a strobe transistor is conducting during the memory read operation. The strobe control signal timing window depends on a discharge rate of the bus and can vary over various process corners and temperatures. The timing window is thus typically chosen to accommodate the discharge rate for the worst-case process corner and temperature combination. A longer strobe control signal timing window results in a longer memory read operation. The embodiments discussed below address this longer memory read operation by, among other things, adjusting the strobe control signal timing window over various process corners and temperatures.

FIG. 1 is an illustration of an example data latch system 100. Data latch system 100 includes data latches $110_0$-$110_N$, sensing circuits $120_0$-$120_N$, a voltage generator 130, and a bus 140. In certain embodiments, bus 140 can be used to transfer data from one data latch 110 to another data latch 110. Also, bus 140 can be used to transfer data into and out of sensing circuits $120_0$-$120_N$—e.g., transfer of data for memory read and program operations.

Each of data latches $110_0$-$110_N$ includes a plurality of transistors 111-116, according to certain embodiments. For simplicity and ease of explanation, the plurality of transistors 111-116 is only illustrated for data latch $110_0$. The plurality of transistors in data latch $110_0$ are arranged in a cross-coupled inverter configuration, in which a gate terminal of n-channel metal-oxide-semiconductor field effect transistor ("nMOSFET" or "nMOS") $113_0$ and a gate terminal of p-channel metal-oxide-semiconductor field effect transistor ("pMOSFET" or "pMOS") $115_0$ are connected to an intermediate node $118_0$. Similarly, a gate terminal of nMOS $114_0$ and a gate terminal of pMOS $116_0$ are both connected to an intermediate node $117_0$. A source terminal of pMOS $115_0$ and a source terminal of pMOS $116_0$ are connected to a power supply voltage $V_{DD}$—e.g., 1.2 V, 1.8 V, 2.4 V, 3.3 V, or 5 V. A source terminal of nMOS $113_0$ and a source terminal of nMOS $114_0$ are connected to ground or 0V. In certain embodiments, pass transistors $111_0$ and $112_0$ are nMOSFETs and can be controlled—via their respective gate terminals—to pass a voltage from bus 140 to intermediate nodes $117_0$ and $118_0$, respectively.

Data latch $110_0$ is one example of a data latch circuit. A person of ordinary in the art will recognize, based on the present disclosure, that other data latch circuits can be used. These other data latch circuits are within the spirit and scope of this disclosure.

Sensing circuits $120_0$-$120_N$ are coupled to data latches $110_0$-$110_N$ via bus 140. Each of sensing circuits $120_0$-$120_N$ includes a sense node 121, a sense transistor 122, a strobe transistor 123, a sense capacitor 124, a sense pre-charge transistor 125, a pass transistor 126, and an input terminal 127. For simplicity and ease of explanation, these internal components of sensing circuits $120_0$-$120_N$ are only illustrated for sense circuit $120_0$. In certain embodiments, sense transistor $122_0$, strobe transistor $123_0$, sense capacitor $124_0$, sense pre-charge transistor $125_0$, and pass transistor $126_0$ perform a memory read operation. A person of ordinary skill in the art will recognize that sense circuits $120_0$-$120_N$ can include additional devices to perform the memory read operation—as well as other operations such as, for example, a memory program operation. These additional devices and operations are within the spirit and scope of the present disclosure.

In certain embodiments, sense capacitor $124_0$ is pre-charged to a voltage provided by bus 140. The voltage on bus 140 is provided by voltage generator 130, which is described in detail below. The voltage on bus 140 is passed to sense node $121_0$ when sense pre-charge transistor $125_0$ is in a conducting state. For example, a voltage can be applied to a gate terminal of nMOS $125_0$—e.g., a voltage greater than the voltage on bus 140 plus a threshold voltage of nMOS $125_0$—so that the voltage on bus 140 passes to sense node $121_0$. During the sense node pre-charge, strobe transistor $123_0$ and pass transistor $126_0$ are in non-conducting states—i.e., these transistors are OFF.

After sense node $121_0$ is pre-charged, sense pre-charge transistor $125_0$ is set to a non-conducting state and pass transistor $126_0$ is set to a conducting state so that sense node $121_0$ is electrically coupled to input terminal $127_0$. In certain embodiments, input terminal $127_0$ can be coupled to a bit line from a Flash memory NAND string. As would be understood by a person of ordinary skill in the art, for a selected memory cell on the NAND string's bit line that conducts in response to an applied word line voltage, a path to ground (or 0V) is formed between input terminal $127_0$ and a selected source transistor connected to ground. Conversely, if the selected memory cell does not conduct in response to the applied word line voltage, the bit line is at a "floating" voltage level.

For the selected memory cell in the conducting state, input terminal $127_0$ and sense node $121_0$ are "pulled" to ground due to the current path to ground on the bit line coupled to input terminal $127_0$. As a result, sense capacitor $124_0$ is discharged due to sense node $121_0$ being pulled to ground.

Conversely, for the selected memory cell in the floating state, input terminal $127_0$ is not pulled to ground because a current path to ground is not formed on the bit line. As a result, sense capacitor $124_0$ does not appreciably discharge into the bit line and remains in a pre-charged state.

In referring to FIG. 1, data latches $110_0$-$110_N$ store data representative of the voltage level at sense nodes $121_0$-$121_N$. For simplicity and ease of explanation, the storage of data by data latches $110_0$-$110_N$ will be described with respect to data latch $110_0$ and sense circuit $120_0$. Prior to data latch $110_0$ storing data representative of the voltage level at sense node $121_0$, bus 140 is pre-charged to a voltage level provided by voltage generator 130. After pre-charging bus 140, voltage generator 130 disconnects its output terminal from bus 140, according to certain embodiments. Voltage generator 130 disconnects its output terminal from bus 140 via a pass transistor, which is described in detail below with respect to FIG. 3.

During a memory read operation, pass transistor $111_0$ in data latch $110_0$ is set to a conducting state so that a voltage on bus 140 is passed to intermediate node $117_0$, according to certain embodiments. Also, during the memory read operation, strobe transistor $123_0$ in sense circuit $120_0$ is set to a conducting state by a strobe control signal applied to the transistor's gate terminal. Depending on the voltage level at sense node $121_O$, bus 140 either (i) discharges due to a current path to ground formed by strobe transistor $123_O$ and sense transistor $122_O$ or (ii) does not appreciably discharge and remains in a pre-charged state.

If the voltage level at sense node $121_O$ is at a level to set sense transistor $122_O$ in a conducting state, then bus 140 is discharged due to the current path to ground formed by strobe transistor $123_O$ and sense transistor $122_O$. As bus 140 discharges, intermediate node $117_O$ in data latch $110_O$ follows the discharge.

Figure 2:
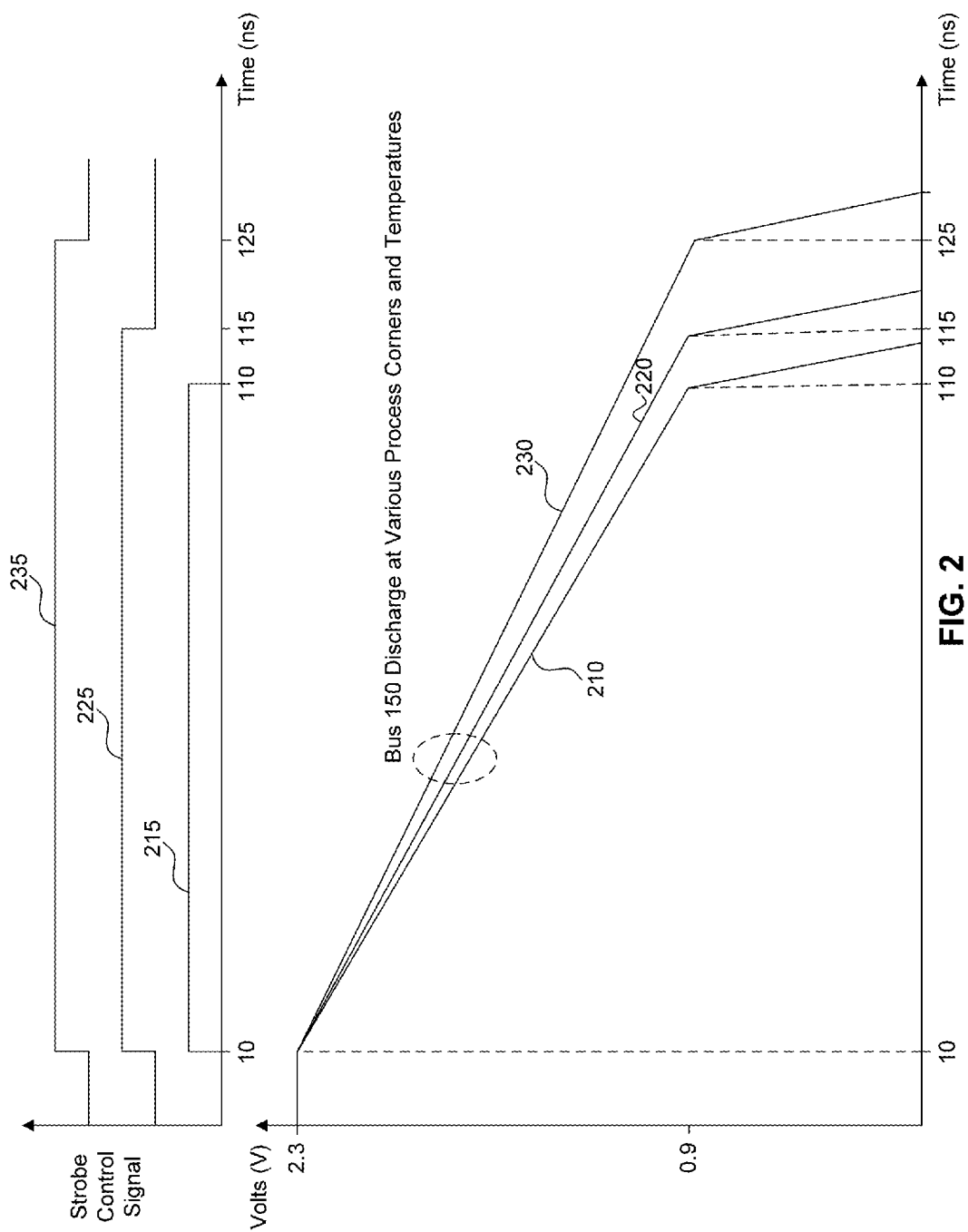
FIG. 2 is an illustration of example waveforms for process corner and temperature variations when discharging a bus.

FIG. 2 illustrates three example waveforms that show the discharge rate of the voltage on bus 140: (i) waveform 210 shows a discharge rate at an "SS" process corner and a low temperature condition; (ii) waveform 220 shows a discharge rate at a "TT" process corner and a regular temperature; and (iii) waveform 230 shows a discharge rate at an "FF" process corner and a high temperature. To illustrate the effects of process corner and temperature variations, a pre-charge voltage on bus 140 can be, for example, 2.3 V across the different process corners and temperatures.

The first letter in "SS," "TT," and "FF" indicates a process corner for nMOS devices and the second letter indicates a process corner for pMOS devices. The letter "F" indicates a fast corner, in which the device has higher carrier mobility than a typical device. The letter "T" indicates a typical corner, in which the device has a typical carrier mobility. And the letter "S" indicates a slow corner, in which the device has a slower carrier mobility than the typical device. Thus, the above process corner notations indicate:
  (i) "SS" has slow nMOS and slow pMOS devices;
  (ii) "TT" has typical nMOS and typical pMOS devices; and
  (iii) "FF" has fast nMOS and fast pMOS devices.

In addition, the "low," "regular," and "high" temperatures can depend on the integrated circuit's application. For example, commercial applications can have a temperature range between 0 and 70° C. Industrial applications can have a temperature range between −40 and 85° C. Automotive applications can have a temperature range between −40 and 125° C. And military applications can have a temperature range between −55 and 155° C. These applications define the "low" and "high" temperature values in which an integrated circuit should be operational within design margins. The "regular" temperature value can be chosen at a temperature between the "low" and "high" temperature values.

In referring to waveform 210 in FIG. 2, at 10 ns, a strobe control signal 215 sets strobe transistor $123_O$ in a conducting state and the voltage on bus 140 begins to discharge due to the current path to ground formed by strobe transistor $123_O$ and sense transistor $122_O$. When the discharged voltage reaches a certain value—e.g., 0.9 V—pMOS $116_O$ in data latch $110_O$ begins to conduct because intermediate node $117_O$ tracks the voltage discharge on bus 140. When pMOS $116_O$ conducts, the power supply voltage $V_{DD}$ is passed to a gate terminal of nMOS $113_O$ in data latch $110_O$, which sets nMOS $113_O$ in a conducting state. And when in the conducting state, nMOS $113_O$ pulls intermediate node $117_O$—and thus bus 140—to ground.

In waveform 210, nMOS $113_O$ begins to pull bus 140 to ground at approximately 110 ns. At approximately 110 ns, strobe control signal 215 sets strobe transistor $123_O$ to a non-conducting state so that the current path to ground— formed by strobe transistor $123_O$ and sense transistor $122_O$— is disconnected from bus 140. Also, at 110 ns, pass transistor $111_O$ is set to a non-conducting state so that a voltage on bus 140 is disconnected from intermediate node $117_O$. This completes the memory read operation in response to sense node $121_O$ in sense circuit $120_O$ being at a voltage level to set sense transistor $122_O$ to a conducting state—e.g., sense transistor $122_O$ is in the conducting state when a selected memory cell on a bit line is in a non-conducting state. For waveform 210, the strobe control signal timing window— i.e., the period of time in which strobe transistor $123_O$ is set in a conducting state—is approximately 100 ns. As would be understood by a person of ordinary skill in the art, the above operations performed to digitize—via storage of the voltage level on bus 140 in data latch $110_O$—the analog voltage level on sense node $121_O$ is also known as a "strobe operation."

In waveform 220, nMOS $113_O$ in data latch $110_O$ begins to pull bus 140 to ground at approximately 115 ns. Also, at approximately 115 ns, pass transistor $111_O$ is set to a non-conducting state and a strobe control signal 225 sets strobe transistor $123_O$ to a non-conducting state. For waveform 220, the strobe control signal timing window is approximately 105 ns.

And in waveform 230, nMOS $113_O$ begins to pull bus 140 to ground at approximately 125 ns. At approximately 125 ns, pass transistor $111_O$ is set to a non-conducting state and a strobe control signal 235 sets strobe transistor $123_O$ to a non-conducting state. For waveform 230, the strobe control signal timing window is approximately 115 ns.

The above description refers to the storage of data in data latch $110_O$ when sense node $121_O$ in sense circuit $120_O$ is at a voltage level to set sense transistor $122_O$ to a conducting state. A person of ordinary skill in the art will recognize that a similar operation can be used for the storage of data in data latch $110_O$ when sense node $121_O$ is not at a voltage level to set sense transistor $122_O$ to a conducting state—e.g., sense transistor $122_O$ is in a non-conducting state when a selected memory cell on a bit line is in a conducting state.

For example, after bus 140 is pre-charged to a voltage level provided by voltage generator 130, strobe transistor $123_O$ in sense circuit $120_O$ and pass transistor $111_O$ in data latch $110_O$ are set to a conducting state. Since a path to ground is not formed by strobe transistor $123_O$ and sense transistor $122_O$, the voltage level on bus 140 is not appreciably discharged and remains in a pre-charged state. As a result, the pre-charged voltage on bus 140 is passed to intermediate node $117_O$ in data latch $110_O$.

The voltage level at intermediate node $117_O$ sets transistor $114_O$ in data latch $110_O$ in a conducting state. When transistor $114_O$ is in a conducting state, ground is passed to intermediate node $118_O$—which controls a gate terminal of pMOS $115_O$. A ground or 0V potential on the gate terminal of pMOS $115_O$ passes the power supply $V_{DD}$ to intermediate node $117_O$. This completes the memory read operation in response to sense node $121_O$ in sense circuit $120_O$ not being at a voltage level to set sense transistor $122_O$ to a conducting state.

In this scenario, the strobe control signal to disconnect strobe transistor $123_O$ from bus 140 does not depend on a discharge rate of bus 140 to "flip" the state of data latch $110_O$—e.g., it does not depend on a discharge rate for bus 140 to reach a certain voltage so that pMOS $116_O$ in data latch $110_O$ is in a conducting state. This dependency on the discharge rate of bus 140 can adversely impact read performance because, as discussed above with respect to waveforms 210, 220, and 230 of FIG. 2, the discharge rate can vary over different process corners and temperatures. And, to ensure that data latch system 100 properly functions across process corners and different temperatures, the worst case timing window for the strobe control signal—e.g., 115 ns timing window associated with the strobe control signal to set strobe transistor $123_0$ in a conducting state from waveform 230—is typically used by circuit designers.

This issue is further exacerbated over multiple memory read operations performed sequentially. For example, a memory read operation can be performed by the data latch $110_0$/sense circuit $120_0$ pairing, followed by the data latch $110_1$/sense circuit $120_1$ pairing, followed by the data latch $110_2$/sense circuit $120_2$ pairing, and so forth. Due to the strobe control signal's longer timing window to account for process and temperature variations, the performance of sequential memory read operations is degraded.

Figure 3:
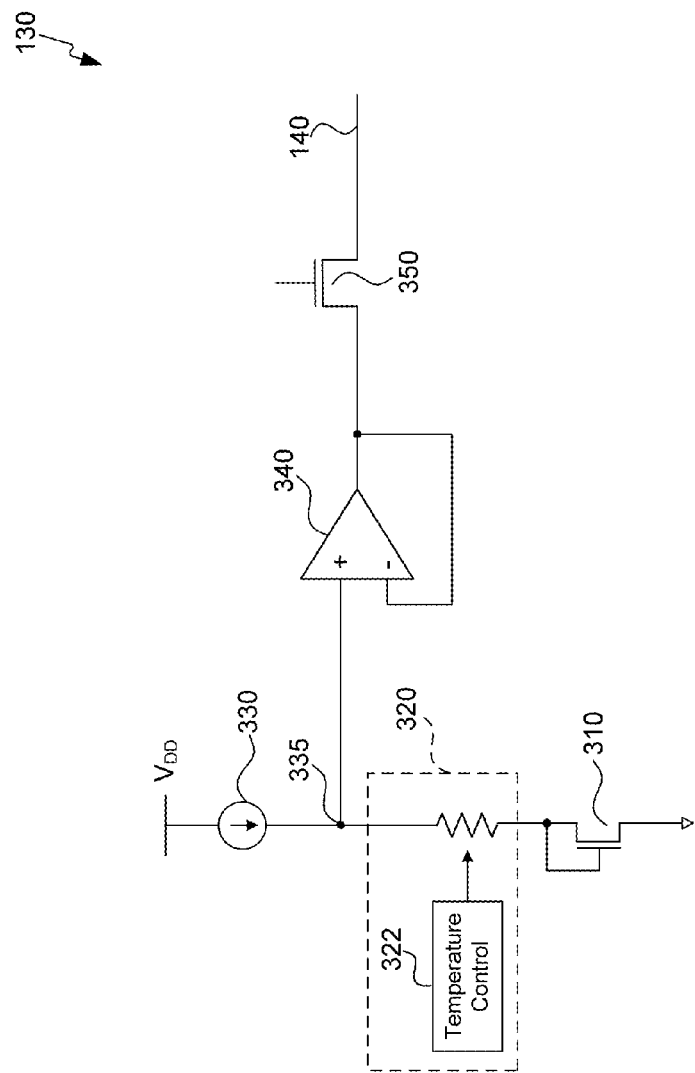
FIG. 3 is an illustration of a voltage generator, according to one or more embodiments.

In referring to FIG. 1, voltage generator 130 is designed to compensate for process and temperature variations so that the strobe control signal timing window can be reduced. FIG. 3 is an illustration of voltage generator 130, according to one or more embodiments. Voltage generator 130 includes a tracking transistor 310, an adjustable resistor circuit 320, a current source 330, a buffer 340, and a pass transistor 350.

In certain embodiments, tracking transistor 310 is the same type of transistor as pass transistor $111_0$ in data latch $110_0$. Tracking transistor 310 and pass transistor $111_0$ can be nMOS devices; alternatively, they can be pMOS devices. Also, tracking transistor 310 has one or more physical characteristics that substantially match one or more respective physical characteristics of pass transistor $111_0$. These one or more physical characteristics can include a gate width dimension, a gate length dimension, and an oxide thickness—to name a few. A person of ordinary skill in the art will recognize and appreciate a variety of other non-enumerated physical characteristics of the tracking transistor (e.g., tracking transistor 310) and/or pass transistor (e.g., pass transistor $111_0$) that may match in certain embodiments.

For example, pass transistor $111_0$ can be a long-channel transistor with a gate length dimension of, for example, 0.4 µm. Tracking transistor 310 can also be a long-channel transistor with the same gate length dimension as pass transistor $111_0$. Long-channel transistors are devices with width and length dimensions long enough such that edge effects from the transistor's channel can be neglected. Long-channel devices are well known in the art. Further, in certain embodiments, tracking transistor 310 and pass transistor $111_0$ are fabricated using the same process technology—e.g., a particular method to fabricate integrated circuits. Based on this disclosure, a person of ordinary skill in the art will recognize that tracking transistor 310 can also be the same type of transistor as pass transistor $112_0$ in data latch $110_0$, have one or more physical characteristics that substantially match one or more respective physical characteristics of pass transistor $112_0$, and/or be fabricated on the same process technology as pass transistor $112_0$.

Adjustable resistor circuit 320 includes a temperature control module 322 to provide an adjustable resistance based on temperature. In certain embodiments, temperature control module 322 communicates with a temperature sensor at or near data latches $110_0$-$110_N$ and/or sense circuits $120_0$-$120_N$ to monitor temperature. Based on a temperature provided by the temperature sensor, temperature control module 322 adjusts a resistance in adjustable resistor circuit 320. The adjustable resistance can be derived from a digital-to-analog (D2A) converter coupled to a resistor ladder with multiple tap points representing multiple resistance values (not shown in FIG. 3), according to certain embodiments. The D2A converter can receive a digital input representative of a sensed temperature and convert that input to an analog output represented by a resistance from the resistor ladder.

Current source 330 provides a current to adjustable resistor circuit 320 and tracking transistor 310—which results in a pre-charge voltage on node 335. Current source 330 can include a bandgap voltage reference to generate the current. As would be understood by a person of ordinary skill in the art, bandgap reference voltages are temperature independent voltage reference circuits.

Buffer 340 includes an input terminal and an output terminal. Buffer 340 receives the pre-charge voltage on node 335 at its input terminal and transfers the voltage to pass transistor 350 via the buffer's output terminal. When in a conducting state, pass transistor 350 passes the pre-charge voltage from buffer 340's output terminal to bus 140.

Tracking transistor 310 is configured such that its gate terminal is connected to its drain terminal, according to certain embodiments. By being the same type of device—with substantially the same physical characteristics—as pass transistor $111_0$ in data latch $110_0$, tracking transistor 310 can "track" the electrical characteristics of pass transistor $111_0$. An nMOS pass transistor $111_0$ shares the same or substantially the same electrical characteristics as an nMOS tracking transistor 310 because they share the same process corner—e.g., "fast," "typical," or "slow"—and have the same or substantially the same physical dimensions.

For example, for a "fast" nMOS tracking transistor 310, the resistance of tracking transistor 310 will be lower than its typical value due to the transistor's higher carrier mobility. With the lower resistance, the pre-charge voltage on node 335 is lower than its typical value. The lower pre-charge voltage on node 335 is passed to bus 140 via buffer 340 and pass transistor 350. In reference to waveform 230 in FIG. 2, which is at a FF process corner and high temperature condition, the pre-charge voltage on bus 140 can be at a voltage level lower than 2.3 V such that the amount of time for bus 140 to discharge to a certain voltage—e.g., 0.9 V—for pMOS $116_0$ in data latch $110_0$ to conduct is reduced.

For example, the lower voltage level can be, for example, 2.0 V, in which the amount of time to discharge bus 140 from 2.0 V to 0.9 V is less than the discharge time from 2.3 V to 0.9 V. A faster discharge time for bus 140 is directly proportional to a reduction in the strobe control signal timing window. Therefore, as a result of tracking transistor 310 being the same type of device—with substantially the same physical characteristics—as pass transistor $111_0$, the strobe control signal timing window can be reduced.

In addition, adjustable resistor circuit 320 can adjust the pre-charge voltage on bus 140 based on temperature. In certain embodiments, in response to an increase in temperature at or near data latches $110_0$-$110_N$ and/or sense circuits $120_0$-$120_N$, adjustable resistor circuit 320 sets its adjustable resistance to achieve a desired pre-charge voltage. In comparing waveform 210 to waveform 230 in FIG. 2, the discharge rate on bus 140 increases as temperature increases. Adjustable resistor circuit 320 can provide a lower resistance value so that voltage generator 130 outputs a lower pre-charge voltage to bus 140 when temperature increases. The lower resistance value provided by adjustable resistor circuit 320 sets a lower value for the pre-charge voltage on bus 140. As a result, the strobe control signal timing window can be reduced.

In certain embodiments, adjustable resistor circuit 320 can also be used to compensate for a rise in resistance due to a "slow" nMOS tracking transistor 310. The "slow" nMOS tracking transistor 310 can result in a higher pre-charge voltage on node 335 than its typical value due to the slower carrier mobility in tracking transistor 310. To compensate for the higher pre-charge voltage on node 335, adjustable resistor circuit 320 sets its adjustable resistance to a lower value so that the resulting pre-charge voltage on node 335 is lower, according to certain embodiments. Again, a lower pre-charge voltage on bus 140 results in a reduction in the strobe control signal timing window.

In summary, voltage generator 130 can set a pre-charge voltage for bus 140 to compensate for process corner and temperature variations. To compensate for process corner variations, tracking transistor 310 in voltage generator 130 can be same type of device—with substantially-matching physical characteristics—as pass transistor $111_O$ in data latch $110_O$, according to certain embodiments. And, to compensate for temperature variations, adjustable resistor circuit 320 in voltage generator 130 can set its resistance to a value to achieve a desired strobe control signal timing window. With this flexibility to adjust the strobe control timing window, memory read operations can be optimized while the data latch system remains functional across varying process corners and temperatures.

Figure 4:
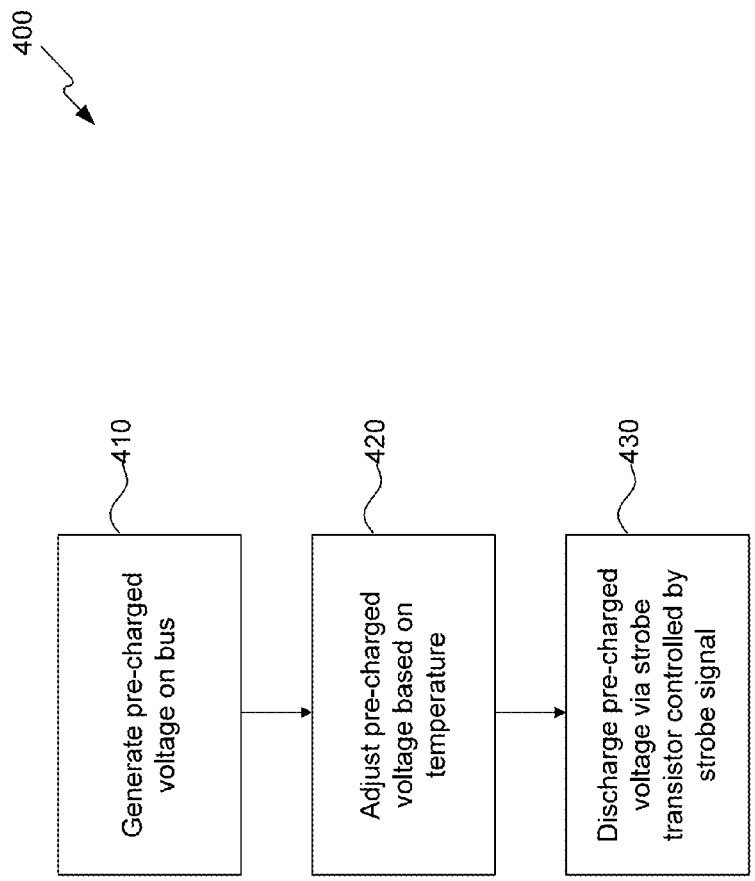
FIG. 4 is an illustration of a method for compensating process corner and temperature variations in an integrated circuit, according to one or more embodiments.

FIG. 4 is an illustration of a method 400 for compensating process corner and temperature variations in an integrated circuit, according to certain embodiments. The operations of method 400 can be performed by, for example, data latch system 100 of FIG. 1.

In operation 410, a pre-charged voltage on a bus (e.g., bus 140 of FIG. 1) is generated. The pre-charged voltage can be generated by, for example, voltage generator 130 in FIGS. 1 and 3. The bus is coupled to a data latch—e.g., data latch $110_O$ of FIG. 1—in which the data latch includes a plurality of transistors and an intermediate node coupled to the bus.

In operation 420, the pre-charged voltage is adjusted based on temperature. The pre-charged voltage can be adjusted by voltage generator 130, which includes a tracking transistor with one or more physical characteristics substantially matching one or more respective characteristics of at least one of the plurality of transistors in the data latch. The adjustment to the pre-charged voltage includes lowering the pre-charged voltage in response to an increase in temperature, according to certain embodiments.

In operation 430, the pre-charged voltage is discharged via a strobe transistor (e.g., strobe transistor $123_O$ in FIG. 1) controlled by a strobe control signal. The pre-charged voltage is discharged by a sense circuit—e.g., sense circuit $120_O$ of FIG. 1. As a result of the discharging operation, a voltage potential on the bus provided by the sensing circuit is stored in the data latch.

Figure 5:
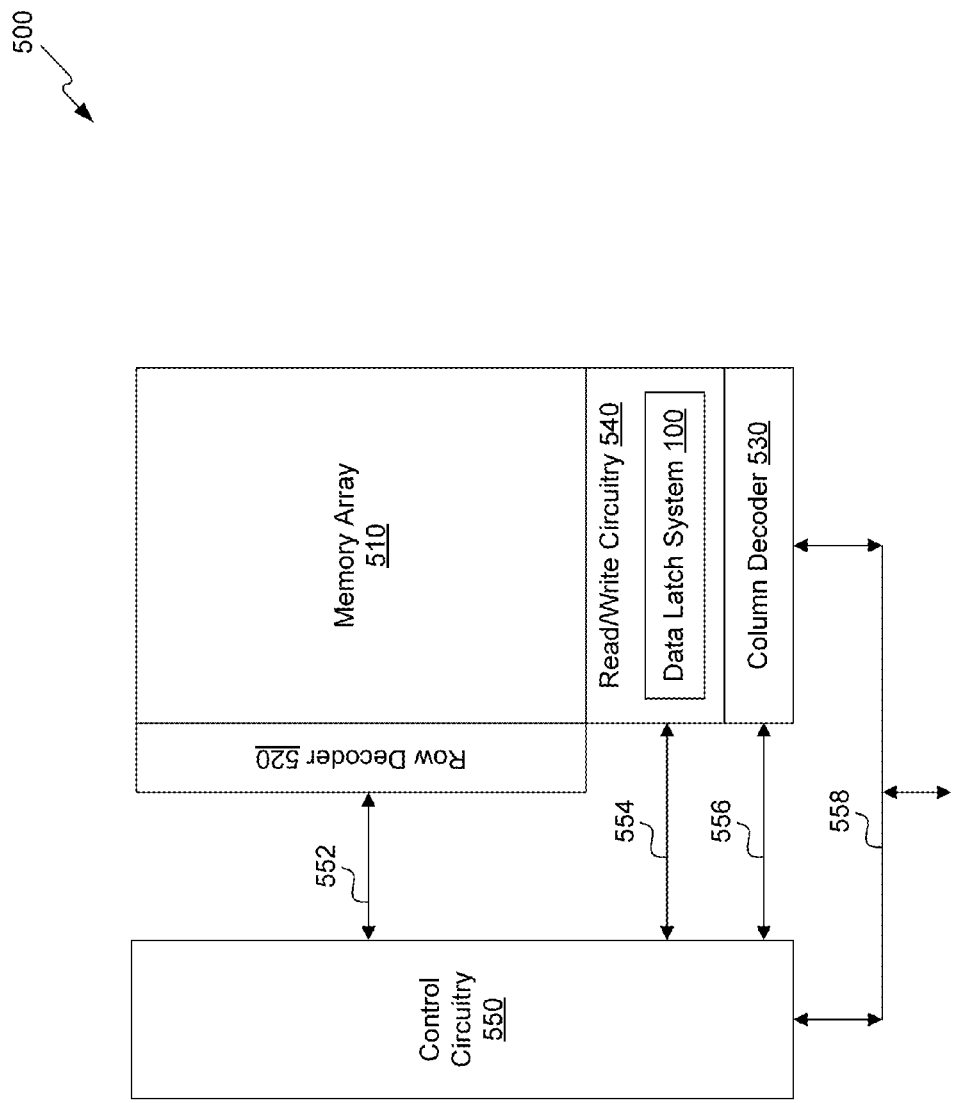
FIG. 5 is an illustration of an example memory system in which one or more embodiments can be implemented.

FIG. 5 is an illustration of an example memory system 500 in which one or more embodiments can be implemented. Memory system 500 includes a memory array 510, a row decoder 520, a column decoder 530, read/write circuitry 540, and control circuitry 550.

Memory array 510 includes an array of memory cells arranged in a row-column format. In certain embodiments, the row-column format is a word line/bit line format. The word lines are accessed by row decoder 520. And the bit lines are accessed by column decoder 530 and read/write circuitry 540. The memory cells in memory array 500 can be volatile or non-volatile memory cells. Examples of volatile memory cells include, but are not limited to, dynamic random access memory cells and static random access memory cells. Examples of non-volatile memory cells include, but are not limited to, erasable programmable read-only memory cells, electrically erasable programmable read-only memory cells, Flash memory cells (e.g., NAND- and NOR-type arrangements), ferroelectric random access memory cells, magnetoresistive random access memory cells, and printed ferroelectric memory cells.

Read/write circuitry 540 includes data latch system 100, according to certain embodiments. With data latch system 100, read/write circuitry can perform read and other memory operations on memory array 510. For example, data latch system can be coupled to bit lines in memory array 510— e.g., via input terminals $127_O$-$127_N$ in sense circuits $120_O$-$120_N$—and perform memory read operations as described above. A person of ordinary skill in the art will recognize, based on this disclosure, that other memory operations can be performed with data latch system 100 such as, for example, a program verify operation.

Control circuitry 550 communicates with row decoder 520 via bus 552, read/write circuitry 540 via bus 554, and column decoder 530 via bus 556. For example, via bus 552, control circuitry 550 can communicate address information to row decoder 520. Similarly, via bus 556, control circuitry 550 can communicate address information to column decoder 530. And, via bus 554, control circuitry 550 can communicate control information to read/write circuitry 540. Control circuitry 550 also includes a bus 558, which can be used to communicate data and commands between memory system 500 and an external circuit such as, for example, a memory controller.

Though an example memory system is described above, a person of ordinary skill in the art will recognize that embodiments in this disclosure can be applied to other applications. These other applications are within the spirit and scope of this disclosure.

It is to be appreciated that the Detailed Description section—and not the Summary and Abstract sections—is intended to be used to interpret the claims. The Summary and Abstract sections may set forth one or more but not all contemplated embodiments. Thus, the Summary and Abstract sections are not intended to limit the embodiments or the appended claims in any way.

While this disclosure has been described with reference to embodiments for exemplary fields and applications, it should be understood that the embodiments are not limited thereto. Other embodiments and modifications thereto are possible, and are within the spirit and scope of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the disclosure should not be limited by any of the above-described embodiments, but should be defined only in accordance with the following claims and their equivalents.

What is claimed is:

1. A system comprising:
   a bus;
   a data latch comprising a plurality of transistors coupled to the bus; and
   a voltage generator comprising a tracking transistor,
   wherein one or more physical characteristics of the tracking transistor substantially match one or more respective physical characteristics of at least one of the plurality of transistors in the data latch, and
   wherein the voltage generator is configured to adjust a pre-charged voltage on the bus based on an electrical characteristic of the tracking transistor.

2. The system of claim 1, wherein the system further comprises:
   a sensing circuit coupled to the data latch via the bus, wherein the sensing circuit comprises a strobe transistor controlled by a strobe control signal, wherein the strobe control signal comprises a strobe control signal timing window based on a discharge rate of the pre-charged voltage, and wherein the discharge rate is based on the electrical characteristic of the tracking transistor.

3. The system of claim 1, wherein the voltage generator comprises an adjustable resistor circuit coupled to the tracking transistor and a current source, wherein the adjustable resistor circuit is configured to change a resistor value between the tracking transistor and the current source based on monitored temperature.

4. The system of claim 1, wherein the voltage generator is configured to lower the pre-charged voltage in response to an increase in temperature.

5. The system of claim 1, wherein the tracking transistor comprises a connection between a drain terminal of the tracking transistor and a gate terminal of the tracking transistor.

6. The system of claim 1, wherein the tracking transistor and the at least one of the plurality of transistors in the data latch are n-channel metal-oxide-semiconductor field-effect transistors.

7. The system of claim 1, wherein the at least one of the plurality of transistors in the data latch comprises a pass transistor for the data latch.

8. The system of claim 1, wherein the one or more physical characteristics of the tracking transistor comprise gate width and gate length dimensions.

9. A method comprising:
   generating, with a voltage generator, a pre-charged voltage on a bus coupled to a data latch; and
   adjusting the pre-charged voltage based on temperature;
   wherein the data latch comprises a plurality of transistors coupled to the bus, and
   wherein the voltage generator comprises a tracking transistor, the tracking transistor comprising one or more physical characteristics that substantially match one or more respective physical characteristics of at least one of the plurality of transistors in the data latch.

10. The method of claim 9, further comprising:
    discharging the pre-charged voltage via a strobe transistor controlled by a strobe control signal.

11. The method of claim 10, wherein discharging the pre-charged voltage further comprises storing a voltage potential on the bus in the data latch.

12. The method of claim 9, wherein the adjusting comprises lowering the pre-charged voltage in response to an increase in temperature.

13. The method of claim 9, wherein the tracking transistor and the at least one of the plurality of transistors in the data latch have the same device type.

14. The method of claim 9, wherein the one or more physical characteristics of the tracking transistor comprise gate width and gate length dimensions.

15. A circuit comprising:
    data latch circuitry coupled to a bus; and
    a voltage generator comprising a tracking transistor, wherein:
    a physical characteristic of the tracking transistor is configured to correspond to a physical characteristic of a transistor of the data latch circuitry, and
    the voltage generator is configured to vary a pre-charge voltage potential on the bus based on an electrical characteristic of the tracking transistor.

16. The circuit of claim 15, wherein the physical characteristic of the tracking transistor configured to correspond to the physical characteristic of the transistor of the data latch circuitry comprises one or more of a transistor dimension, a gate dimension, a gate width, a gate length, a transistor process, and an oxide thickness.

17. The circuit of claim 15, wherein the tracking transistor and the transistor of the data latch circuitry are fabricated using a same process technology.

18. The circuit of claim 15, wherein:
    a first terminal of the tracking transistor is coupled to the common node; and
    a second terminal of the tracking transistor is coupled to the bus and a gate terminal of the tracking transistor.

19. The circuit of claim 18, wherein the second terminal of the tracking transistor is coupled to the bus through an adjustable resistor circuit, the adjustable resistor circuit configured to change a resistor value between the second terminal and the bus based on a temperature signal.

20. The circuit of claim 15, wherein the voltage generator is configured to vary the pre-charge voltage potential on the bus based on a temperature signal, the voltage generator further comprising:
    a current source configured to generate a current;
    adjustable resistance circuitry configured to change a resistor value between the tracking transistor and the current source based on the temperature signal; and
    temperature control circuitry configured to select an amount of resistance provided by the adjustable resistance circuitry based on the temperature signal.

* * * * *